(12) United States Patent
Chen et al.

(10) Patent No.: US 9,397,714 B1
(45) Date of Patent: Jul. 19, 2016

(54) RADIO FREQUENCY RECEIVER CIRCUIT AND THE INDUCTOR-COUPLING SINGLE-ENDED INPUT DIFFERENTIAL-OUTPUT LOW-NOISE AMPLIFIER THEREOF

(71) Applicant: Intel Corporation, Santa Clara, CA (US)

(72) Inventors: Hsien-Ku Chen, New Taipei (TW); Pei-Wei Chen, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/849,684

(22) Filed: Sep. 10, 2015

(30) Foreign Application Priority Data

Jun. 26, 2015 (CN) .......................... 2015 1 0362915

(51) Int. Cl.
*H03F 3/45* (2006.01)
*H04B 1/16* (2006.01)
*H03F 3/193* (2006.01)

(52) U.S. Cl.
CPC .................. *H04B 1/16* (2013.01); *H03F 3/193* (2013.01); *H03F 3/45179* (2013.01); *H03F 2200/294* (2013.01); *H03F 2200/451* (2013.01)

(58) Field of Classification Search
CPC ........... G01R 27/02; H03F 1/42; H03F 1/565; H03F 3/193; H03F 3/45179; H03F 2200/451; H03F 2200/294; H04B 1/16
USPC .......................................................... 375/316
See application file for complete search history.

(56) References Cited

U.S. PATENT DOCUMENTS

| 8,094,752 B2* | 1/2012 | Friedrich | H04B 1/69 375/130 |
| 8,674,764 B2* | 3/2014 | Kondo | H03F 1/0277 330/165 |
| 2005/0134434 A1* | 6/2005 | Nagai | G06K 19/0723 340/10.1 |
| 2010/0052784 A1* | 3/2010 | Yamaguchi | H03F 1/22 330/252 |
| 2010/0090767 A1* | 4/2010 | Ohnishi | H03F 1/0272 330/277 |
| 2011/0279184 A1* | 11/2011 | Chan | H03F 1/223 330/295 |
| 2014/0320205 A1* | 10/2014 | Lyalin | H01F 27/2804 330/185 |
| 2014/0320252 A1* | 10/2014 | Sun | H01F 27/2804 336/200 |
| 2014/0335808 A1* | 11/2014 | Pullela | H03F 3/19 455/188.1 |
| 2015/0349726 A1* | 12/2015 | Han | H03F 1/42 330/250 |

* cited by examiner

*Primary Examiner* — Freshteh N Aghdam
(74) *Attorney, Agent, or Firm* — Schiff Hardin LLP

(57) ABSTRACT

The present invention presents a RF receiver circuit including an inductor-coupling single-ended input differential-output LNA, a mixer circuit, and a differential trans-impedance amplifier. The inductor-coupling single-ended input differential-output LNA includes a single-ended input, a balance-to-unbalance transformer, and an inductor-less differential LNA. The balance-to-unbalance transformer is used to transform the radio frequency signals into a plurality of differential-output first differential signals and includes a first inductor and a second inductor. The inductor-less differential LNA is used to transform the first differential signals into a plurality of differential-output second differential signals, wherein the input impedance of the inductor-coupling single-ended input differential-output LNA is inversely proportional to the square of the coil ratio of the first and second inductor, and the product of the reciprocal of the coil ratio and the input impedance matches the external input impedance of the inductor-coupling single-ended input differential-output LNA.

10 Claims, 5 Drawing Sheets

RADIO FREQUENCY RECEIVER CIRCUIT AND THE INDUCTOR-COUPLING SINGLE-ENDED INPUT DIFFERENTIAL-OUTPUT LOW-NOISE AMPLIFIER THEREOF

CROSS REFERENCE TO RELATED APPLICATIONS

This Application claims priority of China Patent Application No. 201510362915.1, filed on Jun. 26, 2015, the entirety of which is incorporated by reference herein.

BACKGROUND OF THE INVENTION

1. Field of the Invention

The technical field relates to a radio frequency receiver circuit, and more particularly to integrating a transformer and an inductor-less low-noise amplifier into the radio frequency receiver circuit.

2. Description of the Related Art

FIG. 1 is a block diagram of a radio frequency (RF) communication system 10. The RF communication system 10 comprises an antenna 11, an analog processing circuit 12, a digital to analog converter 13, an analog to digital converter 14, and a digital processing circuit 15. The analog processing circuit 12 comprises a RF receiver circuit 121, a RF transmitter circuit 122, and a switch circuit 123. The RF communication system 10 receives/transmits a plurality of radio frequency electromagnetic signals through the antenna 11. The RF receiver circuit 121 is used to process the electromagnetic signals received by the antenna 11. The analog to digital converter 14 is used to convert analog signals processed by the RF receiver circuit 121 from the electromagnetic signals into digital signals. There are many considerations when designing the RF receiver circuit 121. For example, noise factor, linearity of signals, phase delay, chip size, input impedance matching . . . etc. In view of this, the present invention provides an inductor-coupling single-ended input differential-output low-noise amplifier and the corresponding radio frequency receiver circuit for application in the RF receiver circuit 121.

BRIEF SUMMARY OF THE INVENTION

A detailed description is given in the following embodiments with reference to the accompanying drawings.

An embodiment of the present invention provides an inductor-coupling single-ended input differential-output low-noise amplifier for processing a plurality of radio frequency signals received from an antenna. The inductor-coupling single-ended input differential-output low-noise amplifier comprises a single-ended input, a balance-to-unbalance transformer, and an inductor-less differential low-noise amplifier. The single-ended input is used to receive the radio frequency signals. The balance-to-unbalance transformer is electrically connected to the single-ended input and is used to transform the radio frequency signals into a plurality of differential-output first differential signals. The balance-to-unbalance transformer comprises a first inductor and a second inductor, wherein the first terminal of the first inductor is electrically connected to the single-ended input for receiving the radio frequency signals, and the second terminal of the first inductor is electrically connected to ground. The second inductor comprises a first terminal and a second terminal for outputting the differential-output first differential signals, wherein the input impedance of the inductor-coupling single-ended input differential-output low-noise amplifier is inversely proportional to the square of the coil ratio of the first and second inductor, and the product of the reciprocal of the coil ratio and the input impedance matches the external input impedance of the inductor-coupling single-ended input differential-output low-noise amplifier. The inductor-less differential low-noise amplifier is electrically connected to the balance-to-unbalance transformer and is used to transform the first differential signals into a plurality of differential-output second differential signals.

An embodiment of the present invention provides a radio frequency receiver circuit for processing a plurality of radio frequency signals received from an antenna. The radio frequency receiver circuit comprises an inductor-coupling single-ended input differential-output low-noise amplifier, a mixer circuit, and a differential trans-impedance amplifier. The inductor-coupling single-ended input differential-output low-noise amplifier for processing a plurality of radio frequency signals received from an antenna comprises a single-ended input, a balance-to-unbalance transformer, and an inductor-less differential low-noise amplifier. The single-ended input is used to receive the radio frequency signals. The balance-to-unbalance transformer is electrically connected to the single-ended input and is used to transform the radio frequency signals into a plurality of differential-output first differential signals. The balance-to-unbalance transformer comprises a first inductor and a second inductor, wherein a first terminal of the first inductor is electrically connected to the single-ended input for receiving the radio frequency signals, and the second terminal of the first inductor is electrically connected to ground. The second inductor comprises a first terminal and a second terminal for outputting the differential-output first differential signals, wherein the input impedance of the inductor-coupling single-ended input differential-output low-noise amplifier is inversely proportional to the square of the coil ratio of the first and second inductor, and the product of the reciprocal of the coil ratio and the input impedance matches the external input impedance of the inductor-coupling single-ended input differential-output low-noise amplifier. The inductor-less differential low-noise amplifier is electrically connected to the balance-to-unbalance transformer and is used to transform the first differential signals into a plurality of differential-output second differential signals. The mixer circuit is electrically connected to the inductor-coupling single-ended input differential-output low-noise amplifier, wherein the mixer circuit performs a down-conversion operation on the second differential signals to generate corresponding differential alternating current signals. The differential trans-impedance amplifier is electrically connected to the mixer circuit, wherein the differential trans-impedance amplifier is used to transform the differential alternating current signals into a plurality of differential-output alternating voltage signals.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Figure 1:
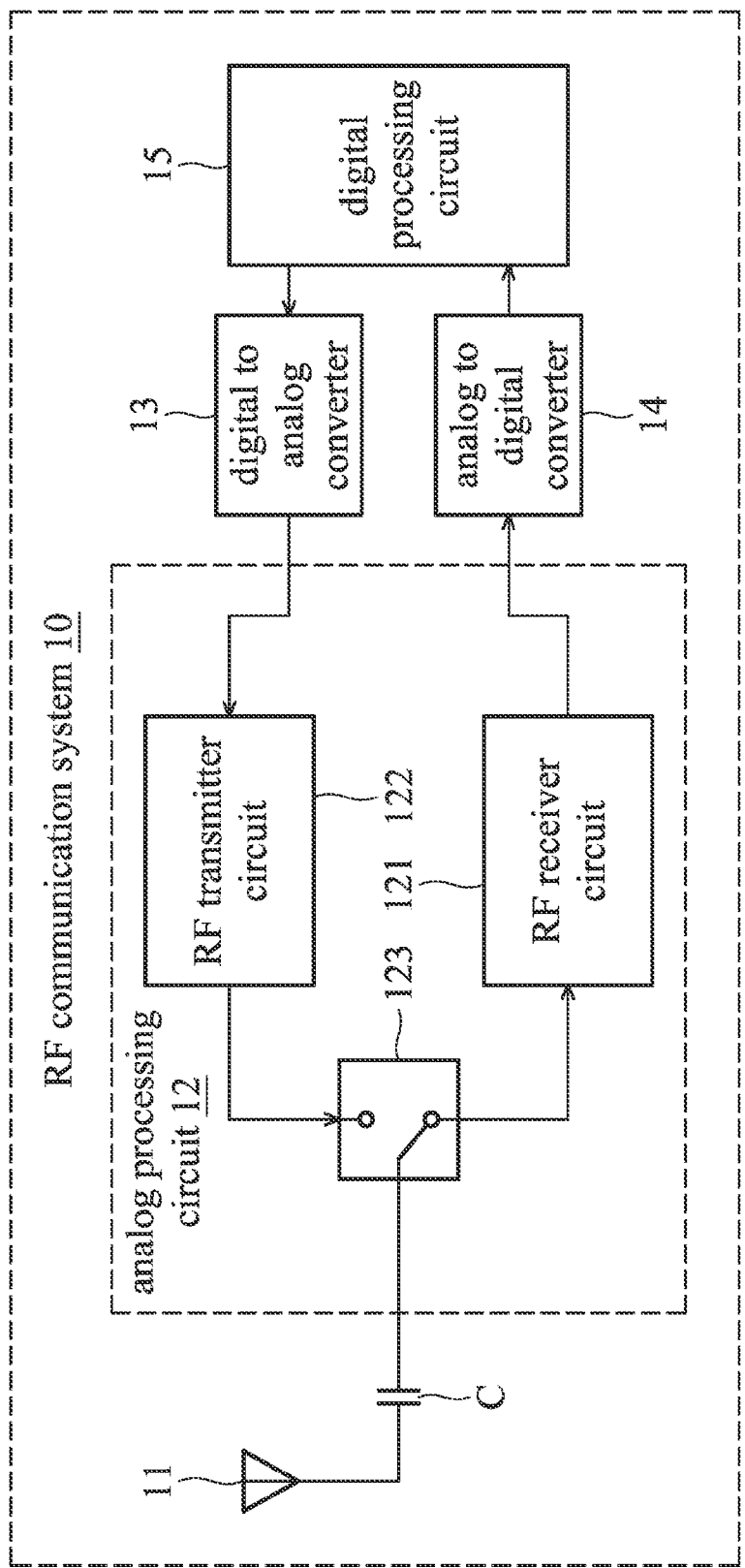
FIG. 1 is a block diagram of a radio frequency communication system 10.
Figure 2:
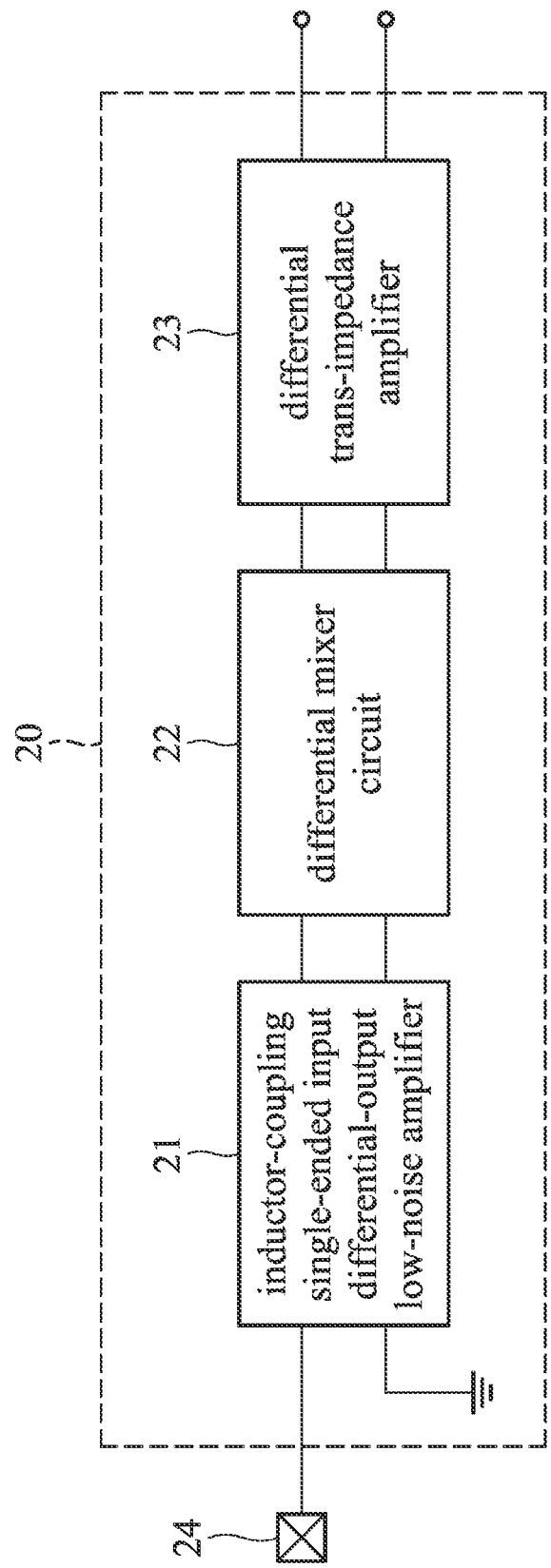
FIG. 2 is a block diagram of a radio frequency receiver circuit 20 according to a first embodiment of the present invention.

FIG. 2 is a block diagram of a radio frequency (RF) receiver circuit 20 according to a first embodiment of the present invention. In the first embodiment, the RF receiver circuit 20 is used to apply to the RF receiver circuit 121 of the RF communication system 10 of FIG. 1. The RF receiver circuit 20 is used to process radio signals received by the antenna 11. The RF receiver circuit 20 comprises an inductor-coupling single-ended input differential-output low-noise amplifier 21, a differential mixer circuit 22, a differential trans-impedance amplifier 23, and a single-ended input 24. The inductor-coupling single-ended input differential-output low-noise amplifier 21 is electrically connected to the single-ended input 24, and is used to transform the radio signals received from the single-ended input 24 into a plurality of differential-output first differential signals. The differential mixer circuit 22 is electrically connected to the inductor-coupling single-ended input differential-output low-noise amplifier 21. The differential mixer circuit 22 performs a down-conversion operation on the first differential signals to generate corresponding differential alternating current signals. The differential trans-impedance amplifier 23 is electrically connected to the differential mixer circuit 22. The differential trans-impedance amplifier 23 is used to transform the differential alternating current signals into a plurality of differential-output alternating voltage signals as output of the RF receiver circuit 20. In the first embodiment, the inductor-coupling single-ended input differential-output low-noise amplifier 21, the differential mixer circuit 22, the differential trans-impedance amplifier 23, and the single-ended input 24 are integrated on a single chip.

Figure 3:
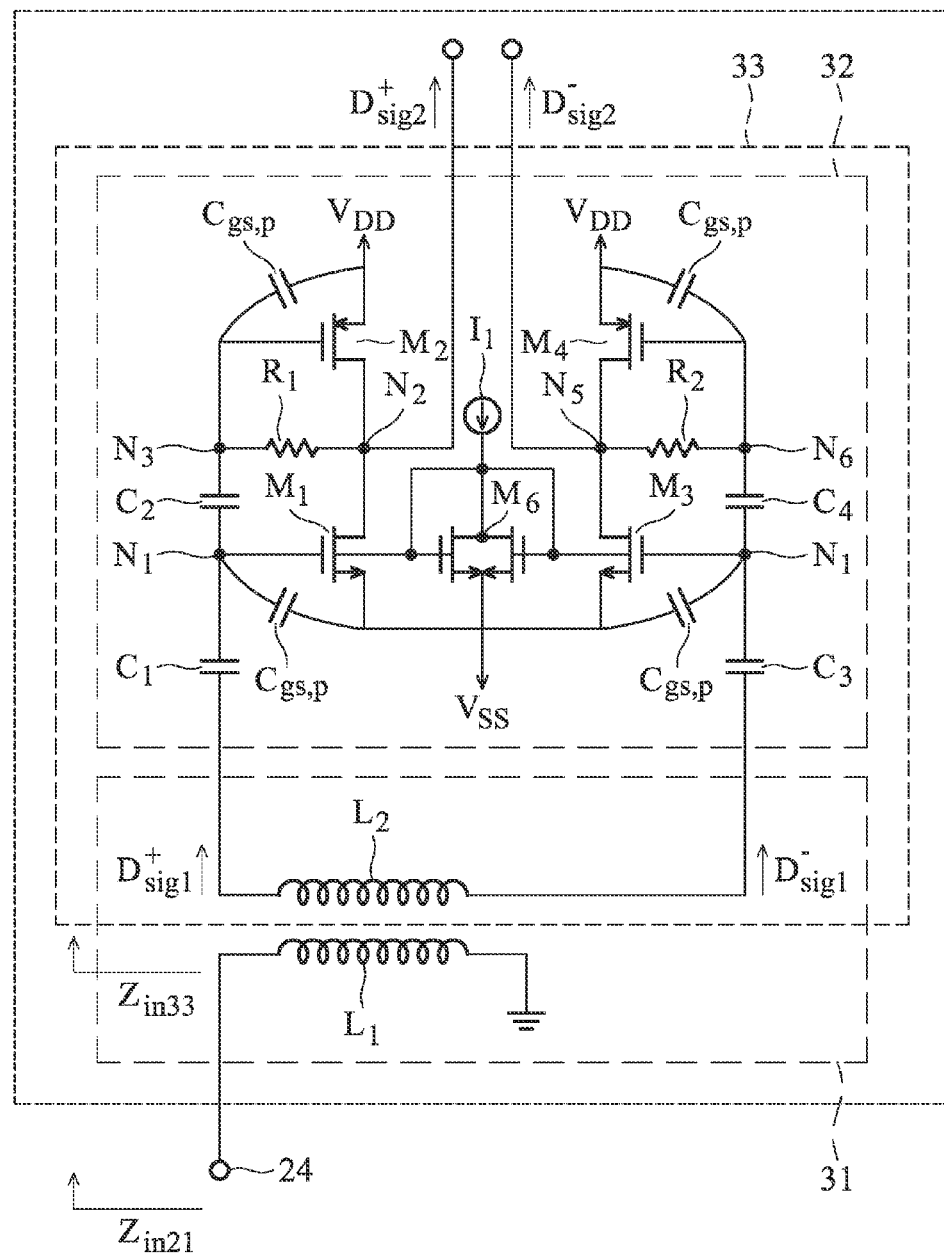
FIG. 3 is a block diagram of an inductor-coupling single-ended input differential-output low-noise amplifier 21 according to a second embodiment of the present invention.

FIG. 3 is a block diagram of an inductor-coupling single-ended input differential-output low-noise amplifier 21 according to a second embodiment of the present invention. In the second embodiment, the inductor-coupling single-ended input differential-output low-noise amplifier 21 comprises a balance-to-unbalance transformer 31 and an inductor-less differential low-noise amplifier 32. The balance-to-unbalance transformer 31 is respectively electrically connected to the single-ended input 24 and the inductor-less differential low-noise amplifier 32. The balance-to-unbalance transformer 31 comprises a first inductor $L_1$ and a second inductor $L_2$. In the second embodiment, the balance-to-unbalance transformer 31 is used to transform the radio frequency signals received by the single-ended input 24 into a plurality of differential-output differential voltage signals ($D_{sig1+}$ and $D_{sig1-}$ shown in FIG. 3). The first terminal of the first inductor $L_1$ is electrically connected to the single-ended input 24 for receiving the radio frequency signals, and the second terminal of the first inductor $L_1$ is electrically connected to ground. The first terminal and the second terminal of the second inductor $L_2$ are respectively used for outputting the differential-output differential voltage signals $D_{sig1+}$ and $D_{sig1-}$ to the next inductor-less differential low-noise amplifier 32. In addition, the first inductor $L_1$ and the second inductor $L_2$ have a coil ratio $N_c$.

In the second embodiment, the inductor-less differential low-noise amplifier 32 comprises a first transistor $M_1$, a second transistor $M_2$, a third transistor $M_3$, a fourth transistor $M_4$, a fifth transistor $M_5$, a sixth transistor $M_6$, a first resistor $R_1$, a second resistor $R_2$, a first capacitor $C_1$, a second capacitor $C_2$, a third capacitor $C_3$, and a fourth capacitor $C_4$. As shown in FIG. 3, a gate of the first transistor $M_1$ is electrically connected to a first node $N_1$, a source of the first transistor $M_1$ is electrically connected to a first voltage source $V_{SS}$, and a drain of the first transistor $M_1$ is electrically connected to a second node $N_2$. A gate of the second transistor $M_2$ is electrically connected to a third node $N_3$, a source of the second transistor $M_2$ is electrically connected to a second voltage source $V_{DD}$, and a drain of the second transistor $M_2$ is electrically connected to the second node $N_2$. A gate of the third transistor $M_3$ is electrically connected to a fourth node $N_4$, a source of the third transistor $M_3$ is electrically connected to the first voltage source $V_{SS}$, and a drain of the third transistor $M_3$ is electrically connected to a fifth node $N_5$. A gate of the fourth transistor $M_4$ is electrically connected to a sixth node $N_6$, a source of the fourth transistor $M_4$ is electrically connected to the second voltage source $V_{DD}$, and a drain of the fourth transistor $M_4$ is electrically connected to the fifth node $N_5$. As shown in FIG. 3, the first capacitor $C_1$ is electrically connected between the first terminal of the second inductor $L_2$ and the first node $N_1$. The second capacitor $C_2$ is electrically connected between the first node $N_1$ and the third node $N_3$. The third capacitor $C_3$ is electrically connected between the second terminal of the second inductor $L_2$ and the third node $N_3$. The fourth capacitor $C_4$ is electrically connected between the fourth node $N_4$ and the sixth node $N_6$. As shown in FIG. 3, the first resistor $R_1$ is electrically connected between the second node $N_2$ and the third node $N_3$, and the second resistor $R_2$ is electrically connected between the fifth node $N_5$ and the sixth node $N_6$. As shown in FIG. 3, the bias transistor $M_b$ and a first current source $I_1$ are used to provide a DC bias voltage to the first transistor $M_1$ and the third transistor $M_3$.

In the second embodiment, the inductor-less differential low-noise amplifier 32 and the second inductor $L_2$ form a differential low-noise amplifier 33, wherein the differential low-noise amplifier 33 comprises an intrinsic filter. The differential low-noise amplifier 33 receives the differential-output differential voltage signals $D_{sig1+}$ and $D_{sig1-}$, and outputs corresponding differential voltage signals $D_{sig2+}$ and $D_{sig2-}$. The intrinsic filter is used to filter the noise in the differential voltage signals $D_{sig1+}$ and $D_{sig1-}$. A central frequency of the intrinsic filter is related to the second inductor $L_2$ and a plurality of parasitic capacitors $C_{gs,n}$ and $C_{gs,p}$ formed between the gate and the source of the transistors $M_1 \sim M_4$. The relationship is presented as follows:

$$f_0 = 1/2\pi\sqrt{L_2(C_{gs,n}+C_{gs,p})} \quad (1)$$

In the second embodiment, the input impedance $Z_{in33}$ of the differential low-noise amplifier 33 is related to the input impedance $Z_{in21}$ of the inductor-coupling single-ended input differential-output low-noise amplifier 21 and the coil ratio $N_c$, and is presented as follows:

$$Z_{in21} = Z_{in33}/N_c^2 \quad (2)$$

Accordingly, a designer can change an impedance conversion ratio of the input impedance $Z_{in33}$ and the input impedance $Z_{in21}$ by adjusting the coil ratio $N_c$ so that the input impedance $Z_{in21}$ matches the external input impedance (for example, 50 ohm) of the RF receiver circuit 20. In the second embodiment, the input impedance $Z_{in33}$ is related to the resistance $R_{L2}$ of the second inductor $L_2$ and the input impedance $Z_{in32}$ of the inductor-less differential low-noise amplifier 32. The relationship is presented as follows:

$$Z_{in33}=Z_{in32}//(Q_{L2}*R_{L2}) \quad (3),$$

wherein // represents the input impedance $Z_{in32}$ is parallel to the second inductor $L_2$, and $Q_{L2}$ is a quality-factor of the second inductor $L_2$. Accordingly, the designer can change and the input impedance $Z_{in33}$ of the differential low-noise amplifier 33 by adjusting the resistance $R_{L2}$. In the second embodiment, the first inductor $L_1$ and the second inductor $L_2$ of the balance-to-unbalance transformer 31 are not directly electrically connected to each other, an electrostatic discharge (ESD) event occurred at the single-ended input 24 cannot affect the differential low-noise amplifier 33. In other words, the active elements (transistors $M_1$~$M_4$) are not directly electrically connected to package junction of the RF receiver circuit 20 and thus the active elements (transistors $M_1$~$M_4$) cannot be affected by an ESD event. Accordingly, the balance-to-unbalance transformer 31 can DC (direct current) block the electrostatic current from the single-ended input 24. Hence the circuit design of the second embodiment can protect the differential low-noise amplifier 33, the differential mixer circuit 22, and the differential trans-impedance amplifier 23 of the RF receiver circuit 20 from the interference of an ESD event. In addition, the differential low-noise amplifier 33, the differential mixer circuit 22, and the differential trans-impedance amplifier 23 of the RF receiver circuit 20 can effectively combat high-frequency common-mode noise.

Figure 4:
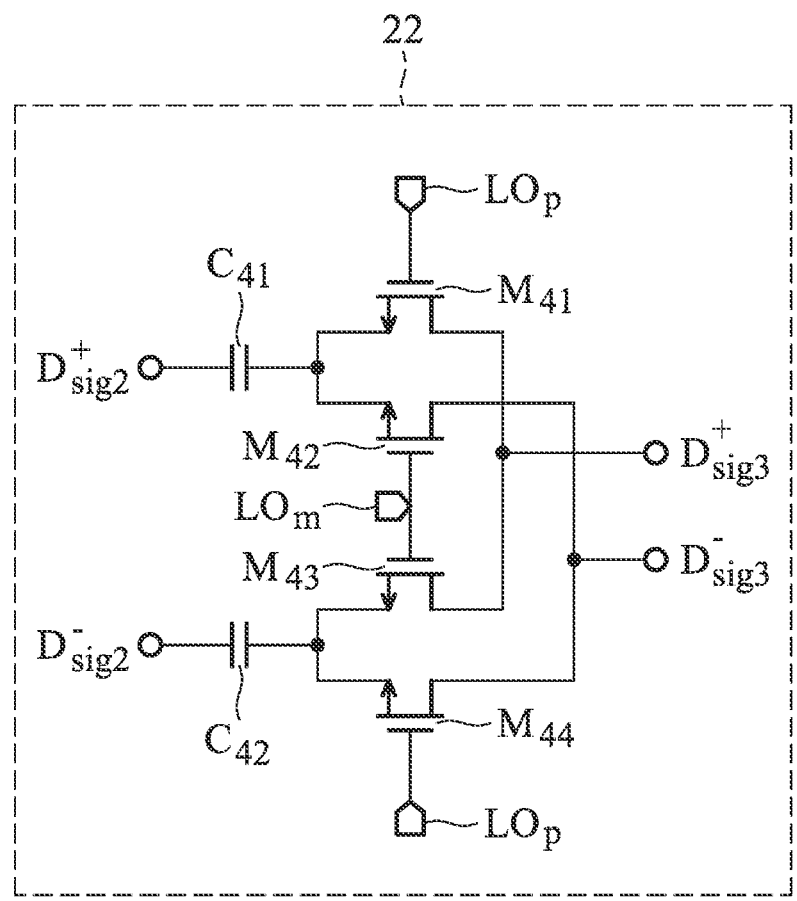
FIG. 4 is a block diagram of a differential mixer circuit 22 according to a third embodiment of the present invention.

FIG. 4 is a block diagram of the differential mixer circuit 22 according to a third embodiment of the present invention. In the third embodiment, the differential mixer circuit 22 comprises a capacitor $C_{41}$, a capacitor $C_{42}$, a transistor $M_{41}$, a transistor $M_{42}$, a transistor $M_{43}$, and a transistor $M_{44}$. In the third embodiment, the differential mixer circuit 22 is a complementary metal-oxide-semiconductor (CMOS) mixer circuit. The differential mixer circuit 22 receives the differential voltage signals $D_{sig2+}$ and $D_{sig2-}$ output from the differential low-noise amplifier 33, and outputs corresponding differential alternating current signals $D_{sig3+}$ and $D_{sig3-}$. It is noticeable that the differential mixer circuit 22 shown in FIG. 4 is only a specific embodiment of the present invention; any mixer circuit having similar circuit functions is not outside the scope of the present invention.

Figure 5:
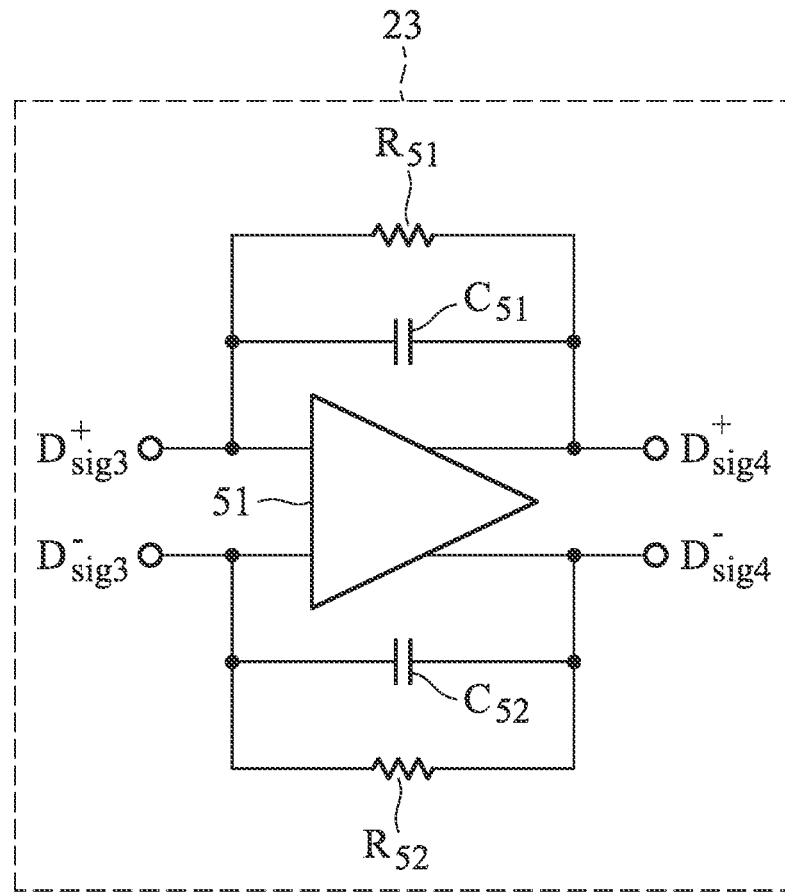
FIG. 5 is a block diagram of a differential trans-impedance amplifier 23 according to a fourth embodiment of the present invention.

FIG. 5 is a block diagram of a differential trans-impedance amplifier 23 according to a fourth embodiment of the present invention. In the fourth embodiment, the differential trans-impedance amplifier 23 receives the differential alternating current signals $D_{sig3+}$ and $D_{sig3-}$ output from the differential mixer circuit 22, and outputs corresponding differential alternating voltage signals $D_{sig4+}$ and $D_{sig-}$. As shown in FIG. 5, the differential trans-impedance amplifier 23 is composed by a resistor $R_{51}$, a resistor $R_{52}$, a capacitor $C_{51}$, a capacitor $C_{52}$, and an amplifier $OP_{51}$. It is noticeable that the differential trans-impedance amplifier 23 shown in FIG. 5 is only a specific embodiment of the present invention; any trans-impedance amplifier having similar circuit functions is not out of the scope of the present invention.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein.

While the present disclosure has been described by way of example and in terms of preferred embodiment, it should be understood that the present disclosure is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. An inductor-coupling single-ended input differential-output low-noise amplifier for processing a plurality of radio frequency signals received from an antenna, comprising:
   a single-ended input, used to receive the radio frequency signals;
   a balance-to-unbalance transformer, electrically connected to the single-ended input, used to transform the radio frequency signals into a plurality of differential-output first differential signals, wherein the balance-to-unbalance transformer comprises:
      a first inductor, wherein a first terminal of the first inductor is electrically connected to the single-ended input for receiving the radio frequency signals, and a second terminal of the first inductor is electrically connected to ground; and
      a second inductor, comprising a first terminal and a second terminal for outputting the differential-output first differential signals, wherein an input impedance of the inductor-coupling single-ended input differential-output low-noise amplifier is inversely proportional to a square of a coil ratio of the first and second inductors, wherein a product of a reciprocal of the coil ratio and the input impedance matches an external input impedance of the inductor-coupling single-ended input differential-output low-noise amplifier; and
   an inductor-less differential low-noise amplifier, electrically connected to the balance-to-unbalance transformer, used to transform the first differential signals into a plurality of differential-output second differential signals.

2. The inductor-coupling single-ended input differential-output low-noise amplifier of claim 1, wherein the second inductor and a plurality of parasitic capacitors of active elements inside the inductor-coupling single-ended input differential-output low-noise amplifier form an intrinsic filter; and
   wherein the intrinsic filter filters out noise of the first differential signals to generate the corresponding second differential signals.

3. The inductor-coupling single-ended input differential-output low-noise amplifier of claim 2, wherein the active elements comprise:
   a first transistor, wherein a gate of the first transistor is electrically connected to a first node, a source of the first transistor is electrically connected to a first voltage source, and a drain of the first transistor is electrically connected to a second node;
   a second transistor, wherein a gate of the second transistor is electrically connected to a third node, a source of the second transistor is electrically connected to a second voltage source, and a drain of the second transistor is electrically connected to the second node;
a first capacitor, electrically connected between the first terminal of the second inductor and the first node;
a second capacitor, electrically connected between the first node and the third node;
a first resistor, electrically connected between the second node and the third node;
a third transistor, wherein a gate of the third transistor is electrically connected to a fourth node, a source of the third transistor is electrically connected to the first voltage source, and a drain of the third transistor is electrically connected to a fifth node;
a fourth transistor, wherein a gate of the fourth transistor is electrically connected to a sixth node, a source of the fourth transistor is electrically connected to the second voltage source, and a drain of the fourth transistor is electrically connected to the fifth node;
a third capacitor, electrically connected between the second terminal of the second inductor and the fourth node;
a fourth capacitor, electrically connected between the fourth node and the sixth node; and
a second resistor, electrically connected between the fifth node and the sixth node.

4. The inductor-coupling single-ended input differential-output low-noise amplifier of claim 3, wherein the parasitic capacitors comprise a parasitic capacitor formed between the gate and the source of the first transistor, a parasitic capacitor formed between the gate and the source of the second transistor, a parasitic capacitor formed between the gate and the source of the third transistor, and a parasitic capacitor formed between the gate and the source of the fourth transistor.

5. The inductor-coupling single-ended input differential-output low-noise amplifier of claim 1, wherein the balance-to-unbalance transformer further Direct Current (DC) blocks the electrostatic current from the single-ended input.

6. A radio frequency receiver circuit for processing a plurality of radio frequency signals received from an antenna, comprising:
an inductor-coupling single-ended input differential-output low-noise amplifier, comprising:
a single-ended input, used to receive the radio frequency signals;
a balance-to-unbalance transformer, electrically connected to the single-ended input, used to transform the radio frequency signals into a plurality of differential-output first differential signals, wherein the balance-to-unbalance transformer comprises:
a first inductor, wherein a first terminal of the first inductor is electrically connected to the single-ended input for receiving the radio frequency signals, and a second terminal of the first inductor is electrically connected to ground; and
a second inductor, comprising a first terminal and a second terminal for outputting the differential-output first differential signals, wherein an input impedance of the inductor-coupling single-ended input differential-output low-noise amplifier is inversely proportional to a square of a coil ratio of the first and second inductors, wherein a product of a reciprocal of the coil ratio and the input impedance matches an external input impedance of the radio frequency receiver circuit;
an inductor-less differential low-noise amplifier, electrically connected to the balance-to-unbalance transformer, used to transform the first differential signals into a plurality of differential-output second differential signals;
a mixer circuit, electrically connected to the inductor-coupling single-ended input differential-output low-noise amplifier, wherein the mixer circuit performs a down-conversion operation on the second differential signals to generate corresponding differential alternating current signals; and
a differential trans-impedance amplifier, electrically connected to the mixer circuit, wherein the differential trans-impedance amplifier is used to transform the differential alternating current signals into a plurality of differential-output alternating voltage signals.

7. The radio frequency receiver circuit of claim 6, wherein the second inductor and a plurality of parasitic capacitors of active elements inside the inductor-coupling single-ended input differential-output low-noise amplifier form an intrinsic filter; and
wherein the intrinsic filter filters out noise of the first differential signals to generate the corresponding second differential signals.

8. The radio frequency receiver circuit of claim 7, wherein the active elements comprise:
a first transistor, wherein a gate of the first transistor is electrically connected to a first node, a source of the first transistor is electrically connected to a first voltage source, and a drain of the first transistor is electrically connected to a second node;
a second transistor, wherein a gate of the second transistor is electrically connected to a third node, a source of the second transistor is electrically connected to a second voltage source, and a drain of the second transistor is electrically connected to the second node;
a first capacitor, electrically connected between the first terminal of the second inductor and the first node;
a second capacitor, electrically connected between the first node and the third node;
a first resistor, electrically connected between the second node and the third node;
a third transistor, wherein a gate of the third transistor is electrically connected to a fourth node, a source of the third transistor is electrically connected to the first voltage source, and a drain of the third transistor is electrically connected to a fifth node;
a fourth transistor, wherein a gate of the fourth transistor is electrically connected to a sixth node, a source of the fourth transistor is electrically connected to the second voltage source, and a drain of the fourth transistor is electrically connected to the fifth node;
a third capacitor, electrically connected between the second terminal of the second inductor and the fourth node;
a fourth capacitor, electrically connected between the fourth node and the sixth node; and
a second resistor, electrically connected between the fifth node and the sixth node.

9. The radio frequency receiver circuit of claim 8, wherein the parasitic capacitors comprise a parasitic capacitor formed between the gate and the source of the first transistor, a parasitic capacitor formed between the gate and the source of the second transistor, a parasitic capacitor formed between the gate and the source of the third transistor, and a parasitic capacitor formed between the gate and the source of the fourth transistor.

10. The radio frequency receiver circuit of claim 6, wherein the balance-to-unbalance transformer further Direct Current (DC) blocks the electrostatic current from the single-ended input.

* * * * *